(12) United States Patent
Park et al.

(10) Patent No.: US 12,165,695 B2
(45) Date of Patent: Dec. 10, 2024

(54) APPARATUSES FOR SENSE AMPLIFIER VOLTAGE CONTROL

(71) Applicant: MICRON TECHNOLOGY, INC., Boise, ID (US)

(72) Inventors: Sang-Kyun Park, Boise, ID (US); Yuan He, Boise, ID (US); Hiroshi Akamatsu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 170 days.

(21) Appl. No.: 17/737,999

(22) Filed: May 5, 2022

(65) Prior Publication Data

US 2023/0360691 A1    Nov. 9, 2023

(51) Int. Cl.
| | | |
|---|---|---|
| G11C 7/00 | (2006.01) | |
| G11C 7/10 | (2006.01) | |
| G11C 11/4074 | (2006.01) | |
| G11C 11/408 | (2006.01) | |
| G11C 11/4091 | (2006.01) | |

(52) U.S. Cl.
CPC ........ G11C 11/4091 (2013.01); G11C 7/1012 (2013.01); G11C 11/4074 (2013.01); G11C 11/4087 (2013.01)

(58) Field of Classification Search
CPC .............. G11C 11/4091; G11C 7/1012; G11C 11/4074; G11C 11/4087
See application file for complete search history.

(56) References Cited

U.S. PATENT DOCUMENTS

| | | | | |
|---|---|---|---|---|
| 2009/0185422 A1* | 7/2009 | Kang | ................. | G11C 16/3427 365/189.11 |
| 2009/0225599 A1* | 9/2009 | Futatsuyama | .......... | G11C 16/08 365/185.11 |
| 2011/0032774 A1* | 2/2011 | Yan | ........................ | G11C 16/24 365/189.011 |
| 2011/0242904 A1* | 10/2011 | Wu | .......................... | G11C 8/08 365/189.11 |

* cited by examiner

*Primary Examiner* — Min Huang
(74) *Attorney, Agent, or Firm* — Dorsey & Whitney LLP

(57) ABSTRACT

Apparatuses including a level shifter circuit are disclosed. An example apparatus according to the disclosure includes a plurality of array access control circuits and a level shifter circuit. The plurality of array access control circuits receive an access control signal and a respective plurality of section enable signals. An array access control circuit of the plurality of array access control circuits provides a section access control signal responsive to the access control signal when a respective section enable signal is in an active state. The level shifter circuit receives a control signal and provides an access control signal responsive to the first signal. A first logic level of the control signal is represented by a first power supply voltage and a first logic level of the access control signal is represented by a second power supply voltage greater than the first power supply voltage.

23 Claims, 9 Drawing Sheets

APPARATUSES FOR SENSE AMPLIFIER VOLTAGE CONTROL

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be amplified by a sense amplifier to indicate the value of the data state stored in the memory cell.

Conventional sense amplifiers are typically coupled to a pair of complementary digit lines to which a large number of memory cells are coupled. As known in the art, when memory cells are accessed, a row of memory cells are activated and sense amplifiers are used to amplify a data state for a respective column of activated memory cells by coupling each of the digit lines of the selected column to voltage supplies such that the digit lines have complementary logic levels.

Each bank includes subunits (e.g., sections, mats). Sense amplifiers for each section may receive control signals to control voltages in the sense amplifiers for their stable and reliable operations. A row decoder for each bank may include an array access control circuit that provides various control signals, such enable signals, bit line voltage control signals, and voltage equalization control signals of sense amplifies for the sections. Because a voltage range in a peripheral region including the row decoder is different from a voltage range in a memory array including sense amplifiers, a voltage range of one or more control signals of each section needs to be shifted from a peripheral region voltage level to a memory array region voltage level by a level shifter. Some control signals may need to be shifted to yet another different range suitable for turning on and off transistors in the sense amplifiers. Including a level shifter for each control signal of each section occupies space and consumes power. To reduce space and power consumption, more effective and efficient level shifter circuits may be desired.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

To provide control signals with suitable voltage levels according to a location of the control signals in a semiconductor memory device, shared level shifting circuits are provided. In particular, a level shifting circuit provides a control signal after voltage level translation to array access control circuits provided for corresponding sections in a bank of a memory cell array.

Figure 1:
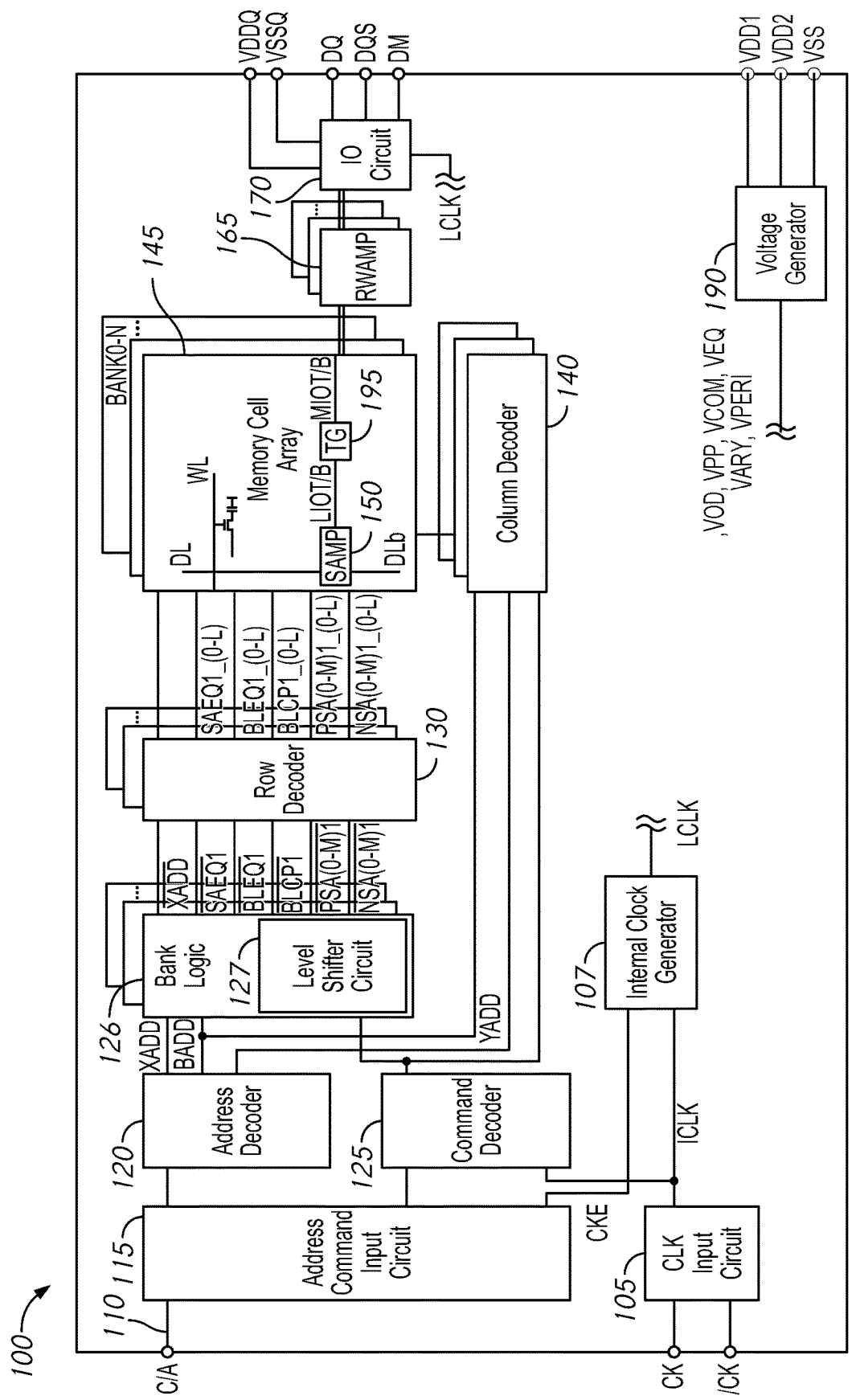
FIG. 1 is a schematic block diagram of a semiconductor memory device according to an embodiment of the disclosure.

FIG. 1 is a schematic block diagram of a semiconductor memory device 100, in accordance with an embodiment of the present disclosure. The semiconductor memory device 100 may include a clock input circuit 105, an internal clock generator 107, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (IO) circuit 170, and a voltage generator circuit 190. The semiconductor memory device 100 may include a plurality of external terminals including address and command terminals coupled to command/address bus 110, clock terminals CK_t and CK_c, data terminals DQ, DQS, and DM, and power supply terminals VDD1, VDD2, VSS, VDDQ, and VSSQ. The terminals and signal lines associated with the command/address bus 110 may include common terminals and signal lines that are configured to receive both command signal and address signals. In other examples, the terminals and signal lines associated with the command and address bus 110 may include a first set of terminals and signal lines that are configured to receive the command signals and a separate, second set of terminals and signal lines that configured to receive the address signals. The semiconductor device may be mounted on a substrate, for example, a memory module substrate, a motherboard or the like.

The memory cell array 145 includes the banks BANK0-N, where N is a positive integer, such as 3, 7, 15, 31, etc. Each bank of the banks BANK0-N may include a plurality of word lines WL, a plurality of digit lines DL and DLb, and a plurality of memory cells MC arranged at intersections of the plurality of word lines WL and the plurality of digit lines DL/DLb. The selection of the word line WL for each bank of the banks BANK0-N is performed by a corresponding row decoder 130 and the selection of the digit line DL/DLb is performed by a corresponding column decoder 140. The plurality of sense amplifiers 150 are coupled to their corresponding digit lines DL and DLb, and coupled to at least one respective local I/O line further coupled to a respective one of at least two main I/O line pairs, via transfer gates TG 195, which function as switches. The sense amplifiers 150 and transfer gates TG 195 may be operated based on control signals from decoder circuitry. The decoder circuitry may include the address decoder 120, bank logic circuits 126, the row decoders 130, the column decoders 140, any control circuitry of the memory cell array 145 of the banks BANK0-N, or any combination thereof.

The address/command input circuit 115 may receive address signals from outside at the command/address terminals via the command/address bus 110 and transmit the address signals to the address decoder 120. The address decoder 120 may decode the address signals received from the address/command input circuit 115 and provide row address signals XADD to the row decoders 130, and column address signals YADD to the column decoders 140. In some embodiments, the address decoder 120 may provide the row address signals XADD to one of the row decoders 130 through one of the bank logic circuits 126. The address decoder 120 may also receive the bank address signals and provide the bank address signals BADD to the bank logic circuits 126 and the column decoders 140.

The address/command input circuit 115 may receive a command signal from outside, such as, for example, a memory controller at the command/address terminals via the command/address bus 110 and provide the command signal to the command decoder 125. The command decoder 125 may decode the command signal and generate various internal command signals. The internal command signals may be used to control operation and timing of various circuits of the semiconductor memory device 100. For example, the internal command signals may include row and column command signals to control circuits to perform access operations to selected word lines and digit lines, such as a read command or a write command.

Accordingly, when activate (ACT) and read (READ) commands are issued and a row address and a column address are timely supplied with the activate and read commands, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when activate (ACT) and write commands are issued and a row address and a column address are timely supplied with the activated and write (WRITE) commands, and the input/output circuit 170 may receive write data at the data terminals DQ, DQS, DM, together with a data strobe signal at DQS and a data mask signal at DM and provide the write data via the read/write amplifiers 165 to the memory cell array 145. Thus, the write data may be written in the memory cell designated by the row address and the column address.

Each bank of the banks BANK0-N has a corresponding bank logic circuit 126. The bank logic circuit 126 locally generates one or more row addresses for a corresponding bank of the banks BANK0-N responsive to an active (ACT) command and the bank address signals BADD for the corresponding bank. The bank logic circuit 126 may provide the locally generated address signals XADD to the corresponding row decoder 130 for the bank. The bank logic circuit 126 may further provide the corresponding row decoder 130 with control signals. The control signals provided by the bank logic circuit 126 may include control signals SAEQ1, BLEQ1, BLCP1, PSAX1, NSAX1. In some embodiments, the bank logic circuit 126 may control timings to activate the control signals SAEQ1, BLEQ1, BLCP1, PSAX1, NSAX1. For example, the activation timing for the control signals may be relative to receipt of the current command (e.g., the activate command ACT).

The bank logic circuit 126 may include a level shifter circuit 127. The level shifter circuit 127 may be used to provide the control signals SAEQ1, BLEQ1, BLCP1, PSAX1, NSAX1 at a voltage level suitable in the memory array region. In some embodiments, not shown in FIG. 1, the bank logic circuit 126 including the level shifter circuit 127 may be included in the row decoder 130. In some embodiments, the row decoder 130 may provide control signals SAEQ1_(0-M), BLEQ1_(0-M), BLCP1_(0-M), PSAX1_(0-M), NSAX1_(0-M) based on the control signals SAEQ1, BLEQ1, BLCP1, PSAX1, NSAX1. Here, M is a positive integer that is associated with a section, such as 3, 7, 15, 31, etc. The control signals SAEQ1 (0-M), BLEQ1_(0-M), BLCP1_(0-M), PSAX1_(0-M), NSAX1_(0-M) may be provided to the sense amplifiers 150 in each section (0-M) of the corresponding bank in the memory cell array 145.

Turning to the explanation of the external terminals included in the semiconductor device 100, the clock terminals CK_t and CK_c may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170. The IO circuit 170 may use the phase controller internal clock signal LCLK as a timing signal for determining an output timing of read data.

The power supply terminals may receive power supply voltages VDD1, VDD2 and VSS. In some embodiments, a voltage level of the power supply voltage VDD1 is greater than a voltage level of the power supply voltage VDD2. These power supply voltages VDD1, VDD2 and VSS may be supplied to a voltage generator circuit 190. The voltage generator circuit 190 may generate various internal voltages, VPP, VEQ, VOD, VCOM, VARY, VPERI, VPP and the like based on the power supply voltages VDD1, VDD2 and VSS. The voltage VPP is mainly used in the row decoder 130, the internal voltages VEQ, VOD, VCOM and VARY are mainly used in the sense amplifiers 150 included in the memory cell array 145, and the internal voltage VPERI is used in many other circuit blocks. In some embodiments, the internal voltage VPERI may be at the same voltage level as the power supply voltage VDD2. In some embodiments, an array voltage VARY and an equalization voltage VEQ, generated from the power supply voltage VDD1, may be greater than the power supply voltage VDD2. For example, the equalization voltage VEQ may be an approximately half voltage of the array voltage VARY. In some embodiments, the voltage generator circuit 190 may generate the equalization voltage VEQ based on the power supply voltage VDD1 by down-conversion. The IO circuit 170 may receive the power supply voltages VDDQ and VSSQ. For example, the power supply voltages VDDQ and VSSQ may be the same voltages as the power supply voltages VDD2 and VSS, respectively. However, the dedicated power supply voltages VDDQ and VSSQ may be used for the IO circuit 170.

Figure 2:
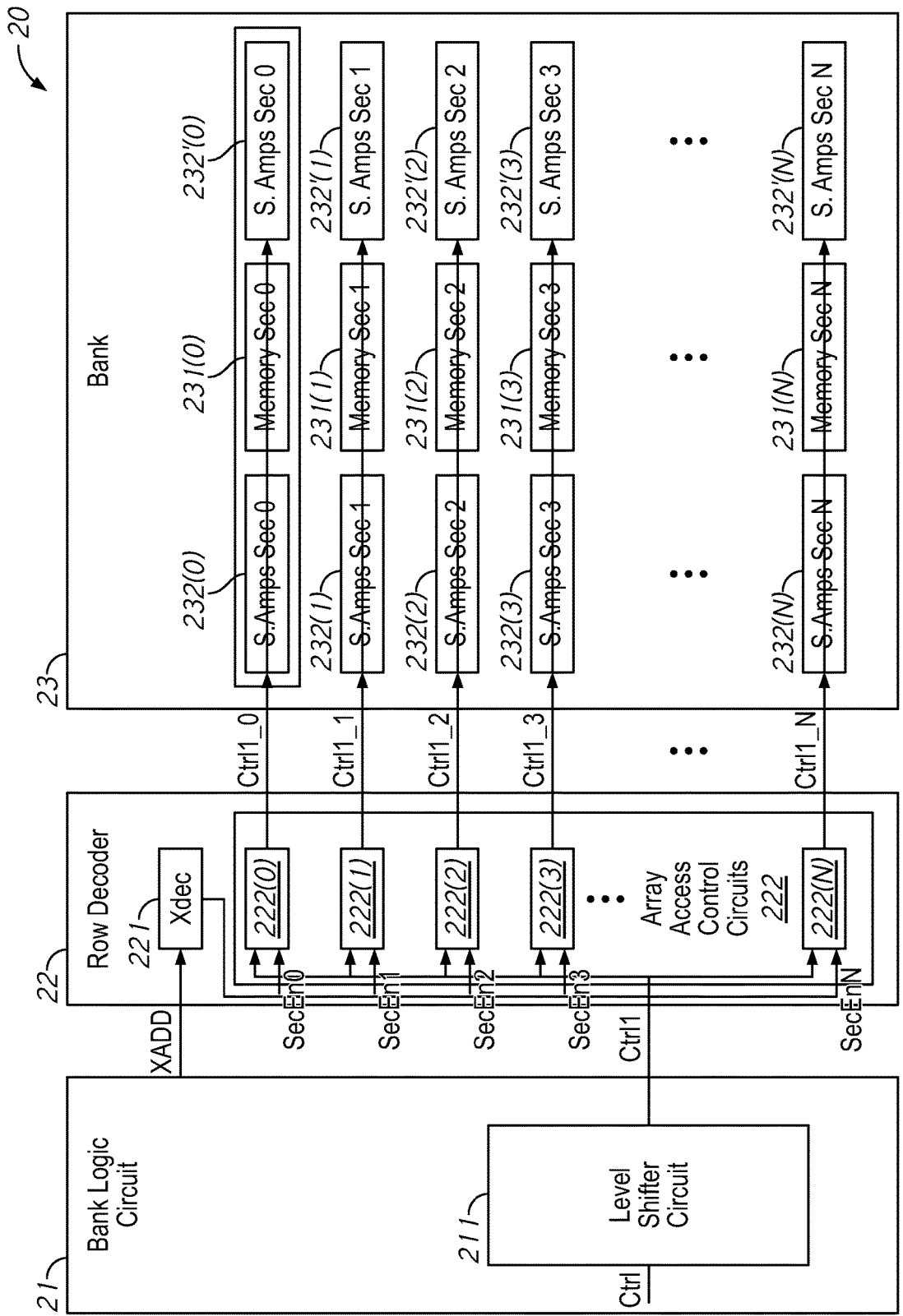
FIG. 2 is a schematic diagram of a bank, and a bank logic circuit and a row decoder for the bank according to an embodiment of the disclosure.

FIG. 2 is a schematic diagram of a bank 23, and a bank logic circuit 21 and a row decoder 22 for the bank 23 according to an embodiment of the disclosure. In some embodiments, the bank 23 may be one of the banks BANK0-N in the memory cell array 145. The row decoder 22 may be one of the row decoders 130. The bank logic circuit 21 may be one of the bank logic circuits 126.

The bank logic circuit 21 may provide row address signals XADD to the row decoder 22. The bank logic circuit 21 may generate an internal control signal Ctrl having a timing based on receipt of the current command (e.g., the activate command ACT). The bank logic circuit 21 may include a level shifter circuit 211. The level shifter circuit 211 may provide control signal Ctrl1 based on the control signal Ctrl. In some embodiments, the control signal Ctrl at a logic high level may be about a peripheral voltage VPERI and the control signal Ctrl1 at a logic high level may have an equalization voltage VEQ or a component voltage VCOM that is higher than the peripheral voltage VPERI. The control signal Ctrl1 may be provided the row decoder 22.

The row decoder may include a row decoder circuit XDEC 221 and array access control circuits 222. The row decoder circuit XDEC 221 may receive the row address signals XADD and provide section enable signals SecEn(0-N), responsive to the row address signals XADD. Here, N is a positive integer that is associated with a section, such as 3, 7, 15, 31, etc. The array access control circuits 222 may include array access control circuits 222(0-N), each associated with a respective memory section 231(0-N) in the bank 23. Each of the array access control circuits 222(0-N) may receive the control signal Ctrl1 and each respective section enable signal of the section enable signals SecEn(0-N). Each of the array access control circuits 222(0-N) may provide control signals Ctrl1 (0-N) responsive to the control signal Ctrl1 and each respective section enable signal of the section enable signals SecEn(0-N). In some embodiments, logic high levels of the control signals Ctrl1 (0-N) may have the equalization voltage VEQ or the component voltage VCOM.

The bank 23 may include memory sections 231. The memory section 231 may include memory section 231(0-N). The bank 23 may also include sense amplifiers 232(0-N) and 232'(0-N) coupled to the respective memory sections 231 (0-N). Each of the sense amplifiers 232(0-N) and 232'(0-N) may receive the respective control signals Ctrl1_(0-N). The sense amplifiers 232(0-N) and 232'(0-N) may operate responsive, at least in part, to the respective control signals Ctrl1_(0-N).

Figure 3A:
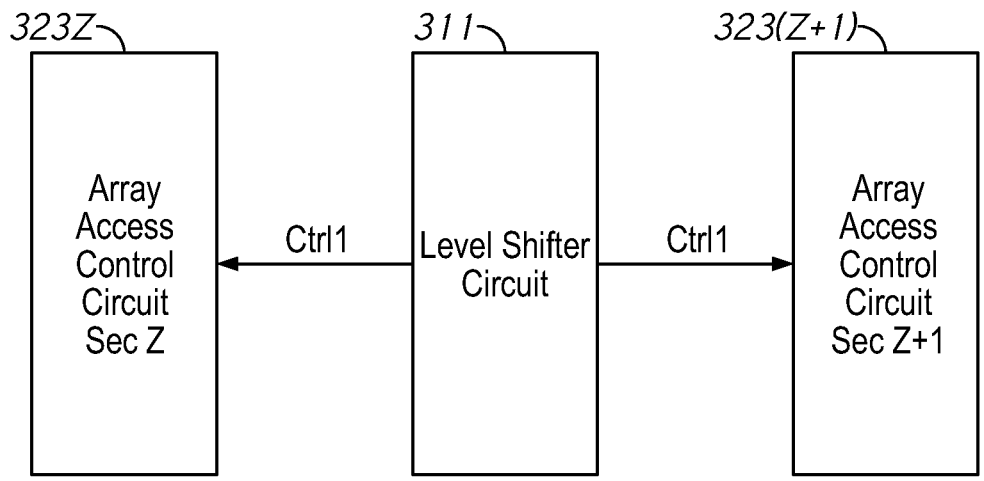
FIG. 3A is a schematic diagram of a level shifter circuit and array access control circuits according to an embodiment of the disclosure.

FIG. 3A is a schematic diagrams of a level shifter circuit 311 and array access control circuits 323Z and 323(Z+1) coupled to the level shifter circuit 311 according to an embodiment of the disclosure. In some embodiments, the level shifter circuit 311 may be included in the level shifter circuit 127 or in the level shifter circuit 211. In some embodiments, the array access control circuits 323Z and 323(Z+1) may be included in the row decoder 130 or in the row decoder 22. The array access control circuits 323Z and 323(Z+1) may be provided for sections Z and (Z+1) in a bank, such as one of the banks BANK0-N in the memory cell array 145.

The level shifter circuit 311 may be disposed between the array access control circuits 323Z and 323(Z+1). The level shifter circuit 311 may provide a control signal Ctrl1 to the array access control circuits 323Z and 323(Z+1).

Figure 3B:
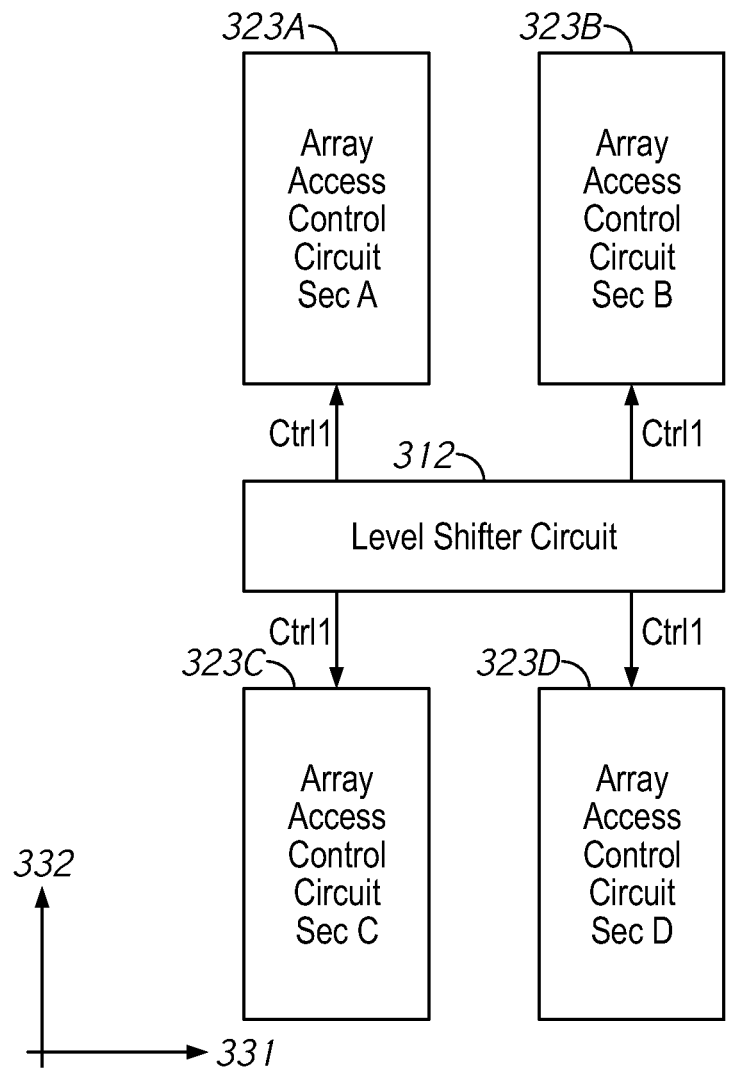
FIG. 3B is a schematic diagram of a level shifter circuit and array access control circuits according to an embodiment of the disclosure.

FIG. 3B is a schematic diagram of a level shifter circuit 312 and array access control circuits 323A-323D coupled to the level shifter circuit 312 according to an embodiment of the disclosure. In some embodiments, the level shifter circuit 312 may be included in the level shifter circuit 127 or in the level shifter circuit 211. In some embodiments, the array access control circuits 323A-323D may be included in the row decoder 130 or in the row decoder 22. The array access control circuits 323A-323D may be provided for sections A-D in a bank, such as one of the banks BANK0-N in the memory cell array 145.

The array control circuits 323A and 323B are adjacent to each other in a direction 331. The array control circuits 323C and 323D are adjacent to each other in the direction 331. The array control circuits 323A and 323C are adjacent to each other in a direction 332 perpendicular to the direction 331. The array control circuits 323B and 323D are adjacent to each other in the direction 332.

The level shifter circuit 312 may be disposed between the array access control circuits 323A-323D. For example, the level shifter circuit 312 may be disposed between the array access control circuits 323B and 323C in a diagonal direction between the directions 331 and 332. The level shifter circuit 312 may be disposed between the array access control circuits 323A and 323D in another diagonal direction between the directions 331 and 332. The level shifter circuit 312 may provide a control signal Ctrl1 to the array access control circuits 323A-323D.

Figure 4:
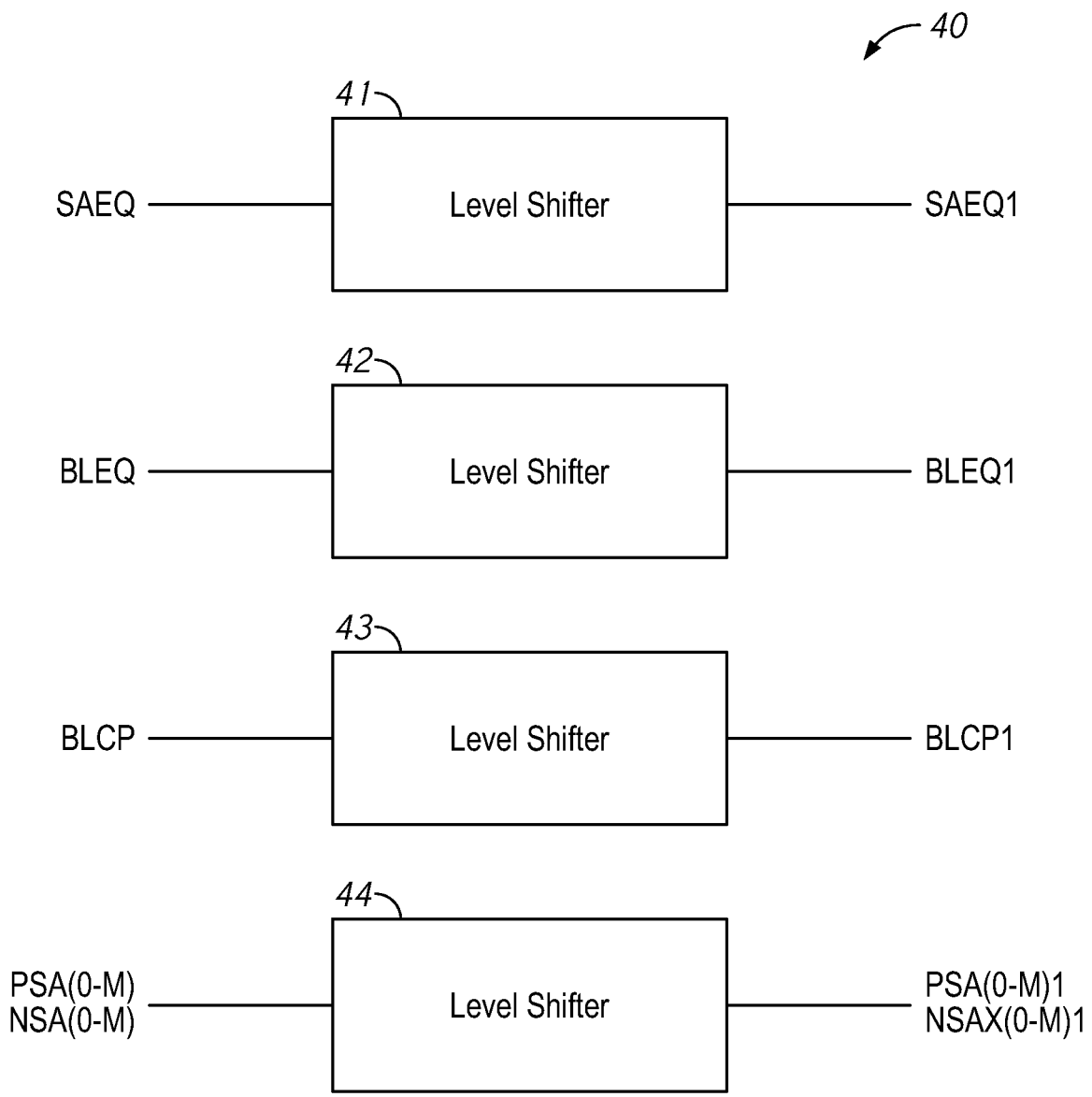
FIG. 4 is a schematic diagram of a level shifter circuit according to an embodiment of the disclosure.

FIG. 4 is a schematic diagram of a level shifter circuit 40 according to an embodiment of the disclosure. In some embodiments, the level shifter circuit 40 may be included in the level shifter circuit 127 or the level shifter circuit 211. In some embodiments, the level shifter circuit 40 may be included in the level shifter circuit 311 or the level shifter circuit 312. The level shifter circuit 40 may include level shifters 41-44. The level shifters 41-44 may receive control signals that may represent a logic high level with the peripheral voltage VPERI. The level shifters 41-44 may provide control signals that may represent the logic high level with the equalization voltage VEQ or a component voltage VCOM that are higher than the peripheral voltage VPERI responsive to the corresponding control signals received.

The level shifter 41 may receive a control signal SAEQ. In some embodiments, the control signal SAEQ may be activated during a precharge operation and/or during a memory access operation, such as a cell information sampling period after performing threshold voltage compensation and before enabling sense amplifiers. The level shifter 41 may provide a control signal SAEQ1 responsive to the control signal SAEQ. The control signal SAEQ1 may have a logic high level at an equalization voltage VEQ.

The level shifter 42 may receive a control signal BLEQ. In some embodiments, the control signal BLEQ may be a bit line equalization signal that may be activated prior to the memory access operation. The level shifter 42 may provide a control signal BLEQ1 responsive to the control signal BLEQ. Responsive to an active control signal BLEQ1, bit lines in the sense amplifiers may be coupled each other to have equal voltage levels.

The level shifter 43 may receive a control signal BLCP. In some embodiments, the control signal BLCP may be a bit line precharge control signal that may be active prior to the memory access operation and until a voltage compensation period of the memory access operation. The level shifter 43 may provide a control signal BLCP1 responsive to the control signal BLCP. Responsive to the active control signal BLCP1, the bit lines may be precharged.

The level shifter 44 may receive control signals PSA(0-M) and control signals NSA(0-M) (e.g., where M is a positive integer). The level shifter 44 may provide control signals PSA(0-M)1 and NSA(0-M)1 responsive to the control signals PSA(0-M) and NSA(0-M). In some embodiments, sense amplifiers may receive power supply voltages at common power supply nodes through transistors coupling the corresponding common power supply nodes to power supply lines. Responsive to the control signals PSA(0-M)1 and NSA(0-M)1, the corresponding transistors may be activated to provide the power supply voltages to the common power supply nodes.

Figure 5:
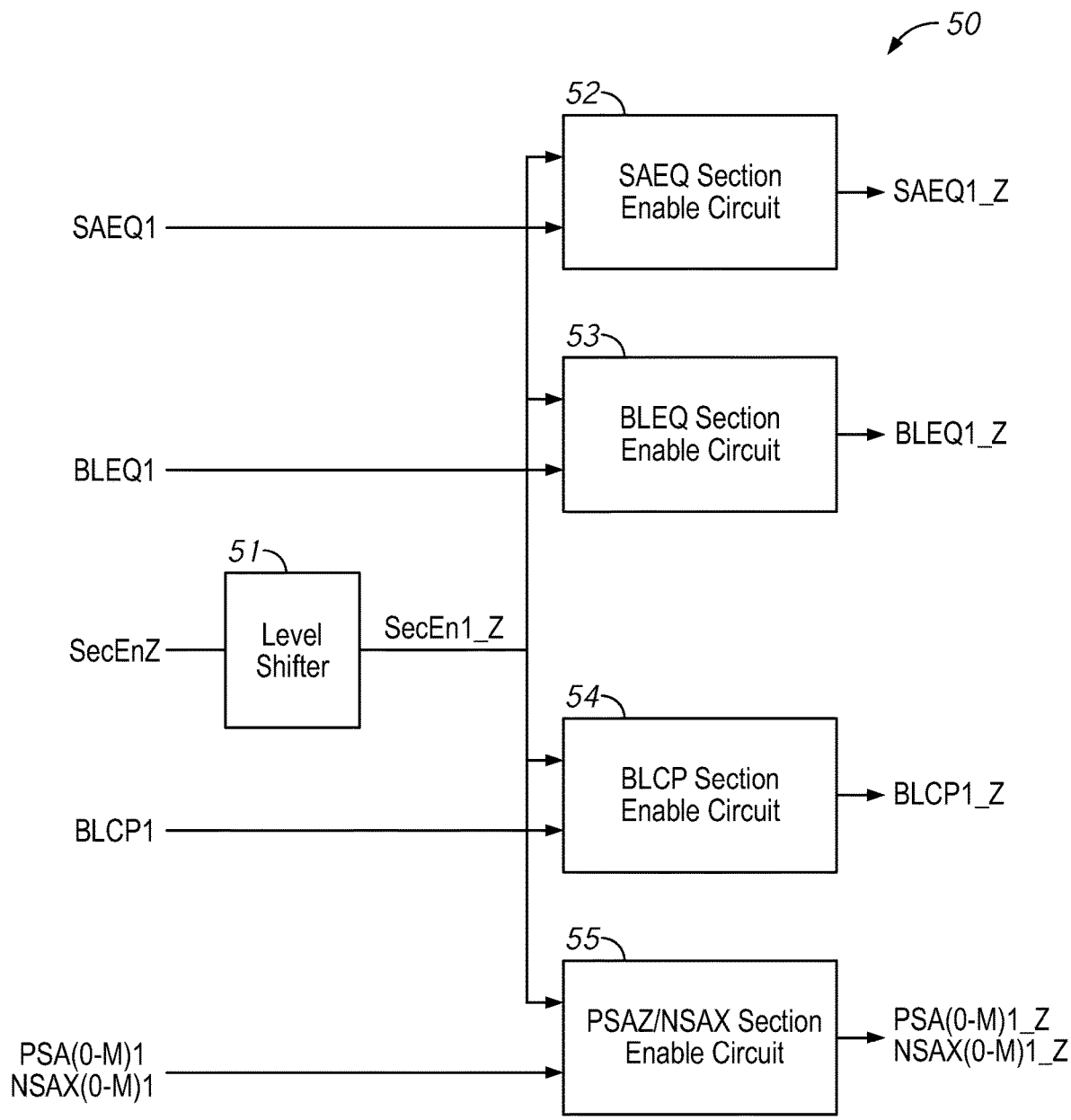
FIG. 5 is a schematic diagram of an array access control circuit for a section according to an embodiment of the disclosure.

FIG. 5 is a schematic diagram of an array access control circuit 50 for a section Z according to an embodiment of the disclosure. In some embodiments, the array access control circuit 50 may be included in one of the row decoders 130. In some embodiments, the array access control circuit 50 may be one of the array access control circuits 222.

The array access control circuit 50 includes a level shifter 51. The level shifter 51 may receive a section enable signal SecEnZ, that may represent a logic high level with the peripheral voltage VPERI, indicative of activation of section Z. The level shifter 51 may provide a section enable signal SecEn1_Z, that may represent the logic high level with the equalization voltage VEQ or a component voltage VCOM that are higher than the peripheral voltage VPERI, responsive to the section enable signal SecEnZ.

The array access control circuit 50 includes section enable circuits 52-55. The section enable circuits 52-55 may receive the control signals having a logic high level with the equalization voltage VEQ or the component voltage VCOM. The section enable circuits 52-55 may also receive the section enable signal SecEn1_Z having a logic high level with the equalization voltage VEQ or the component voltage VCOM.

The section enable circuit 52 may receive a control signal SAEQ1 and the section enable signal SecEn1_Z. In some embodiments, the control signal SAEQ1 may be active either during a precharge operation or during a memory access operation, such as a cell information sampling period after performing threshold voltage compensation and before enabling sense amplifiers. The section enable circuits 52 may provide a control signal SAEQ1_Z responsive to the control signal SAEQ1 and the section enable signal SecEn1_Z. Responsive to an active control signal SAEQ1_Z, common power nodes in the sense amplifiers of the section Z may be provided with an equalization voltage VEQ.

The section enable circuit 53 may receive a control signal BLEQ1 and the section enable signal SecEn1_Z. In some embodiments, the control signal BLEQ1 may be a bit line equalization signal that may be active prior to the memory access operation. The section enable circuits 53 may provide a control signal BLEQ1_Z responsive to the control signal BLEQ1 and the section enable signal SecEn1_Z. Responsive to an active control signal BLEQ1_Z, bit lines in the sense amplifiers of the section Z may be coupled each other to have equal voltage levels.

The section enable circuit 54 may receive a control signal BLCP1 and the section enable signal SecEn1_Z. In some embodiments, the control signal BLCP1 may be a bit line precharge control signal that may be active prior to the memory access operation and until a voltage compensation period of the memory access operation. The section enable circuit 54 may provide a control signal BLCP1_Z responsive to the control signal BLCP1 and the section enable signal SecEn1_Z. Responsive to the active control signal BLCP1_Z, the bit lines in the sense amplifiers of the section Z may be precharged.

The section enable circuit 55 may receive the section enable signal SecEn1_Z, and also receive control signals PSA(0-M)1 and control signals NSA(0-M)1. The section enable circuit 55 may provide control signals PSA(0-M)1_Z and NSA(0-M)1_Z responsive to the section enable signal SecEn1_Z and the corresponding control signals PSA(0-M)1 and NSA(0-M)1. In some embodiments, sense amplifiers in the section Z may receive power supply voltages at common power supply nodes through transistors in the section Z coupling the corresponding common power supply nodes to power supply lines. Responsive to the control signals PSA(0-M)1_Z and NSA(0-M)1_Z, the corresponding transistors in the section Z may be activated to provide the power supply voltages to the common power supply nodes.

Figure 6:
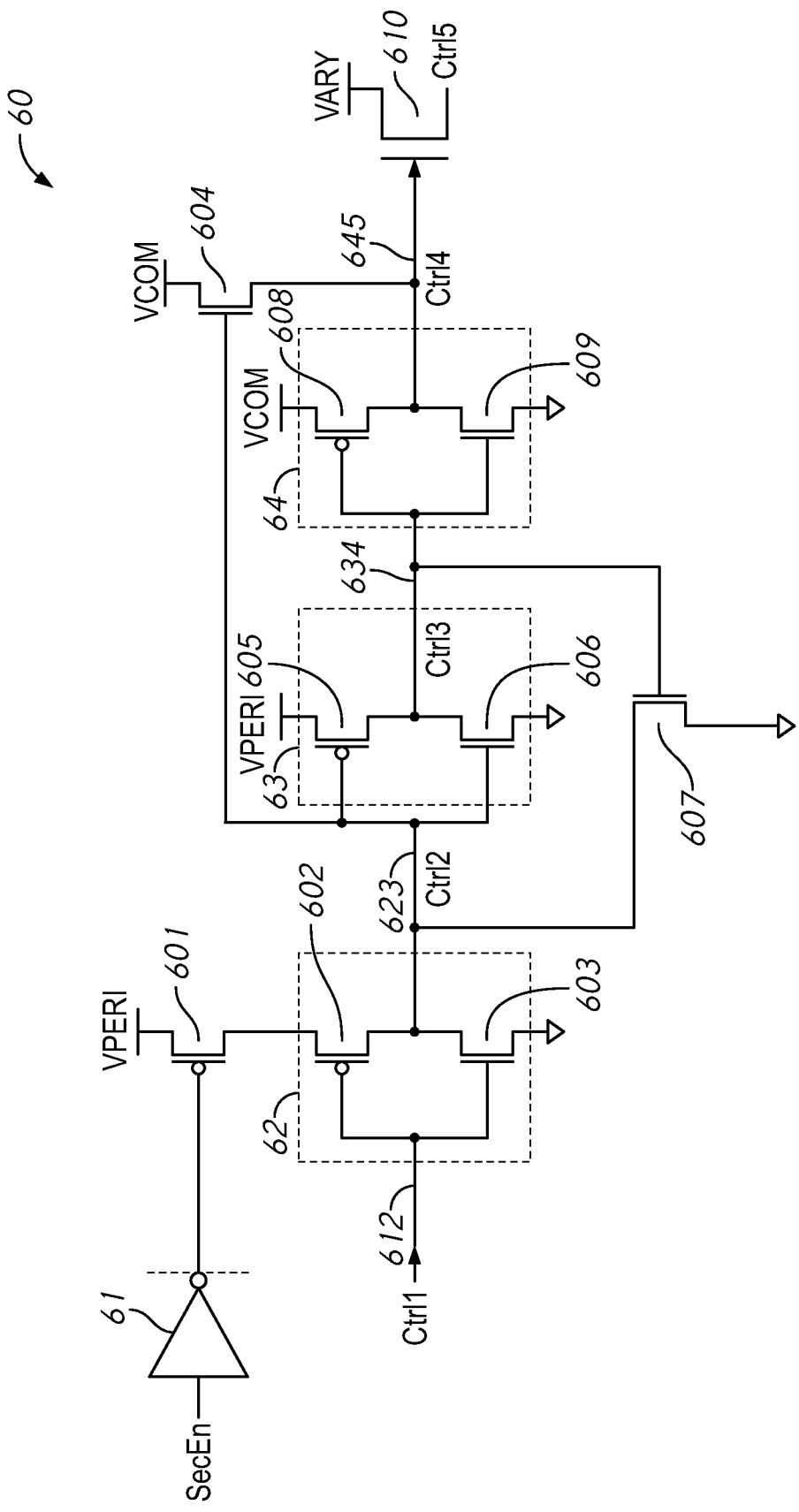
FIG. 6 is a circuit diagram of an array access control circuit for a section according to an embodiment of the disclosure.

FIG. 6 is a circuit diagram of an array access control circuit 60 for a section according to an embodiment of the disclosure. The array access control circuit 60 may be any of the array access control circuits 222, 323 or the array control circuit 50. The array access control circuits 60 may include inverters 61, 62, 63 and 64. The array access control circuits 60 may also include transistors 601, 604, 607 and 610.

The inverter 61 may receive a section enable signal SecEn and provide a section enable signal SecEnF that is a complementary signal of the section enable signal SecEn to a transistor 601. In some embodiments, the transistor 601 may be a first type of transistor (e.g., p-type field effect transistors (PFET)). The transistor 601 may be activated responsive to a logic low level of the section enable signal SecEnF and provide a positive power supply voltage to an inverter 62.

The inverter 62 may receive a control signal Ctrl1 at a node 612. In some embodiments, the inverter 62 may include transistors 602 and 603. The transistors 602 and 603 have gates coupled to each other at the node 612 and drains coupled to each other at a node 623. In some embodiments, the transistor 602 may be the first type of transistor (e.g., p-type field effect transistors (PFET)) and the transistor 603 may be a second type of transistor (e.g., n-type field effect transistors (NFET)). The transistor 602 has a source coupled to the transistor 601. When the transistor 601 is activated, the transistor 602 may receive the positive power supply voltage. The transistor 603 receives a reference power supply voltage. The gates of the transistors 602 and 603 may receive the control signal Ctrl1 at the node 612. When the transistor 601 is activated, the inverter 62 including the transistor 602 and 603 may provide the node 623 with a control signal Ctrl2 that is a complementary signal of the control signal Ctrl1.

The inverter 63 may receive the control signal Ctrl2 at the node 623. In some embodiments, the inverter 63 may include transistors 605 and 606. The transistors 605 and 606 have gates coupled to each other at the node 623 and drains coupled to each other at a node 634. In some embodiments, the transistor 605 may be the first type of transistor (e.g., p-type field effect transistors (PFET)) and the transistor 606 may be a second type of transistor (e.g., n-type field effect transistors (NFET)). The transistor 605 receives a positive power supply voltage. The transistor 606 receives a reference power supply voltage. The gates of the transistors 605 and 606 may receive the control signal Ctrl2 at the node 623. The inverter 63 including the transistor 605 and 606 may provide the node 634 with a control signal Ctrl3 that is a complementary signal of the control signal Ctrl2.

The inverter 64 may receive the control signal Ctrl3 at the node 634. In some embodiments, the inverter 64 may include transistors 608 and 609. The transistors 608 and 609 have gates coupled to each other at the node 634 and drains coupled to each other at a node 645. In some embodiments, the transistor 608 may be the first type of transistor (e.g., p-type field effect transistors (PFET)) and the transistor 609 may be a second type of transistor (e.g., n-type field effect transistors (NFET)). The transistor 608 receives a positive power supply voltage. In some embodiments, the positive power supply voltage may be an equalization voltage VEQ or a component voltage VCOM that are higher than the peripheral voltage VPERI. The transistor 609 receives a reference power supply voltage. The gates of the transistors 608 and 609 may receive the control signal Ctrl3 at the node 634. The inverter 64 including the transistor 608 and 609 may provide the node 645 with a control signal Ctrl4 that is a complementary signal of the control signal Ctrl3.

In some embodiments, the transistor 607 may be a second type of transistor (e.g., n-type field effect transistors (NFET)). The transistor 607 may be coupled to the nodes 623 and 634. The transistor 607 may receive a reference power supply voltage. When the control signal Ctrl3 on the node 634 is active (e.g., at a logic-high level), the transistor 607 may provide the reference power supply voltage to the node 623. Thus, the control signal Ctrl2 on the node 623 becomes inactive (e.g., at a logic-low level).

In some embodiments, the transistor 604 may be a second type of transistor (e.g., n-type field effect transistors (NFET)). The transistor 604 may be coupled to the nodes 623 and 645. The transistor 604 may receive a positive power supply voltage. In some embodiments, the positive power supply voltage may be an equalization voltage VEQ or a component voltage VCOM that are higher than the peripheral voltage VPERI. When the control signal Ctrl2 on the node 623 is active (e.g., at a logic-high level), the transistor 604 may provide the positive power supply voltage to the node 645. Thus, the control signal Ctrl4 on the node 645 becomes active (e.g., at a logic-low level).

In some embodiments, the transistor 610 may be a second type of transistor (e.g., n-type field effect transistors (NFET)). The transistor 610 may receive a positive power supply voltage, such as an array voltage VARY. When the control signal Ctrl4 on the node 645 is active (e.g., at a logic-high level), the transistor 610 may provide the positive power supply voltage, such as the array voltage VARY as an output control signal Ctrl5.

The output control signal Ctrl5 may be a complementary signal of the control signal Ctrl1 with a voltage range from a negative power supply voltage to a positive power supply voltage that is the array voltage VARY.

Operations of the array access control circuit 60 is as follows. When the section enable signal SecEn is in an inactive state (e.g., at a logic low level), the inverter 61 may provide the section enable signal SecEnF in an active state (e.g., at a logic high level) to the transistor 601. The transistor 601 may be deactivated responsive to the logic high level of the section enable signal SecEnF and decouple the inverter 62 from the positive power supply voltage. Thus, the array access control circuit 60 may be deactivated. When the section enable signal SecEn is in an active state (e.g., at a logic high level), the inverter 61 may provide the section enable signal SecEnF in an inactive state (e.g., at a logic low level) to the transistor 601. The transistor 601 may be activated responsive to the logic low level of the section enable signal SecEnF and provide the inverter 62 with the positive power supply voltage. Thus, the array access control circuit 60 may be activated.

While the array access control circuit 60 is enabled, the array access control circuit 60 may receive the control signal Ctrl1. When the control signal Ctrl1 is an inactive state, the control signal Ctrl2 is in an active state, the control signal Ctrl3 may be in an inactive state, and the control signal Ctrl4 may be in an active state. Responsive to the active state of the control signal Ctrl4, the transistor 610 may provide the array voltage VARY as the output control signal Ctrl5. When the control signal Ctrl1 is in an active state, the control signal Ctrl2 is in an inactive state, the control signal Ctrl3 may be in an active state, and the control signal Ctrl4 may be in an inactive state. Responsive to the inactive state of the control signal Ctrl4, the transistor 610 may stop providing the array voltage VARY as the output control signal Ctrl5.

Figure 7:
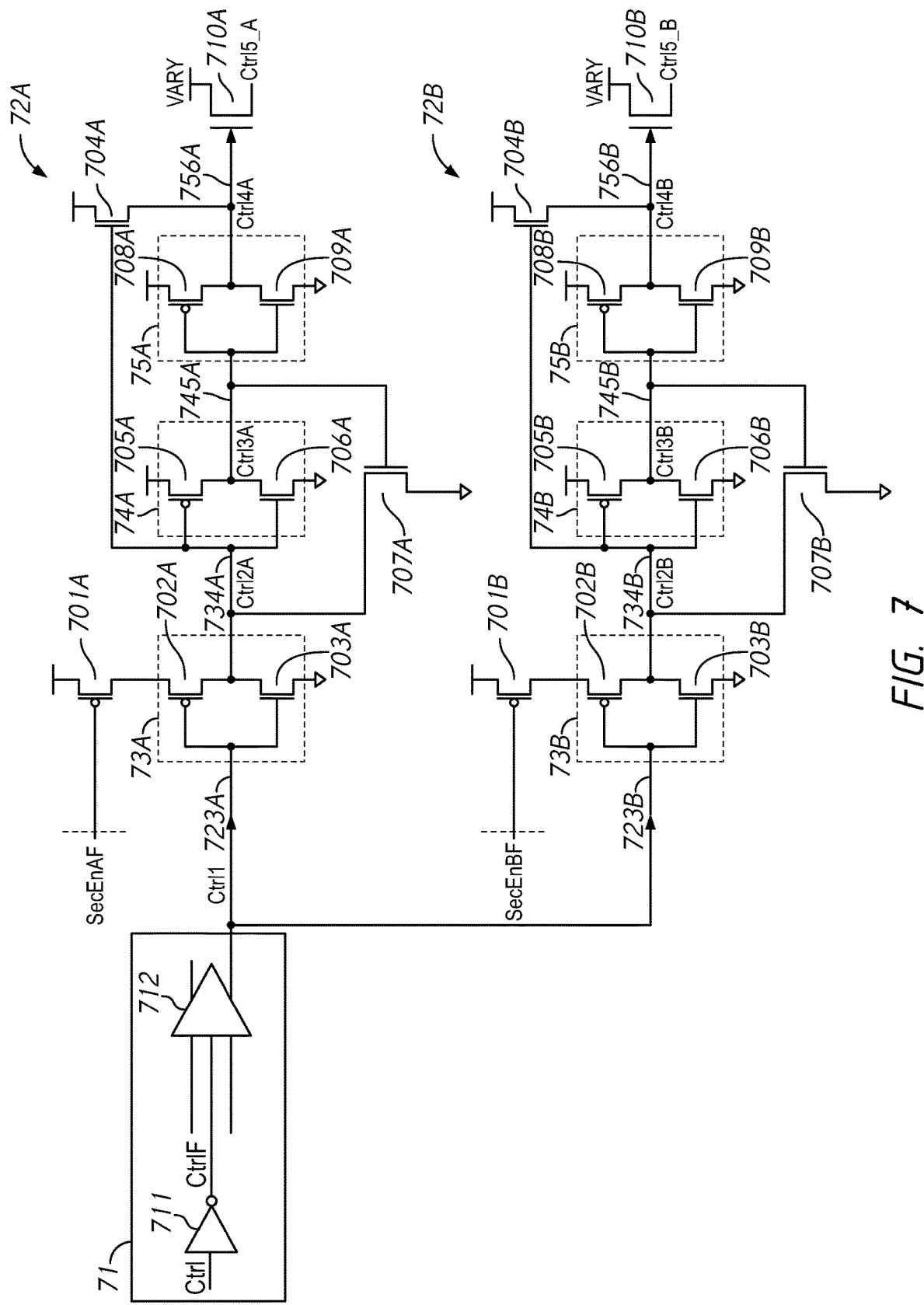
FIG. 7 is a circuit diagram of a level shifter and array access control circuits according to an embodiment of the disclosure.

FIG. 7 is a circuit diagram of a level shifter circuit 71 and array access control circuits 72A and 72B for sections coupled to the level shifter circuit 71 according to an embodiment of the disclosure. The level shifter circuit 71 may be included in the level shifter circuit 211, 311, 312, or any level shifter of the level shifters 41-44. In some embodiments, each of the array access control circuits 72A and 72B may be the array access control circuit 60 earlier described with referring FIG. 6, thus the description of circuit structures of the array access control circuits 72A and 72B is not repeated.

The level shifter circuit 71 may include an inverter 711 and a level shifter 712. The inverter may receive a control signal Ctrl and provide a complementary signal of the control signal CtrlF. The level shifter 712 may receive the control signal CtrlF, that may represent a logic high level with the peripheral voltage VPERI. The level shifter 712 may translate a voltage level of the control signal CtrlF. In some embodiments, the level shifter 712 may provide a control signal Ctrl1 that may represent the logic high level with the equalization voltage VEQ or a component voltage VCOM that are higher than the peripheral voltage VPERI, responsive to the logic high level of the control signal CtrlF. The level shifter 712 may provide the control signal Ctrl1 that may represent the logic low level with the reference power supply voltage, responsive to the logic low level of the control signal CtrlF.

The array access control circuits 72A and 72B may be provided for section A and B in a same bank. The array access control circuits 72A and 72B may receive section enable signals SecEnAF and SecEnBF, respectively. The section enable signals SecEnAF and SecEnBF are active-low signals. For example, enable statuses of section A and section B may be represented by a logic low level. The array access control circuits 72A and 72B may also receive the control signal Ctrl1 from the level shifter circuit 71.

In the example of FIG. 7, a logic level of the section enable signal SecEnAF is low ("L"), and section A is enabled. Responsive to the logic low level of the section enable signal SecEnAF, a transistor 701A may be activated. The transistor 701A may provide the inverter 73A with the positive power supply voltage. Thus, the array access control circuit 72A may be activated. While the array access control circuit 72A is enabled, the array access control circuit 72A may receive the control signal Ctrl1 at the node 723A. When the control signal Ctrl1 is an inactive state, the control signal Ctrl2A is in an active state, the control signal Ctrl3A may be in an inactive state, and the control signal Ctrl4A may be in an active state. Responsive to the active state of the control signal Ctrl4A, the transistor 710A may provide the array voltage VARY as the output control signal Ctrl5A. When the control signal Ctrl1 is in an active state, the control signal Ctrl2A is in an inactive state, the control signal Ctrl3A may be in an active state, and the control signal Ctrl4A may be in an inactive state. Responsive to the inactive state of the control signal Ctrl4A, the transistor 710A may stop providing the array voltage VARY as the output control signal Ctrl5_A.

In the example of FIG. 7, a logic level of the section enable signal SecEnBF is high ("H"), and section B is disabled. Responsive to the logic high level of the section enable signal SecEnBF, a transistor 701B may be deactivated. The transistor 701B may decouple the inverter 73B from the positive power supply voltage. Thus, the array access control circuit 72B may be deactivated.

Figure 8:
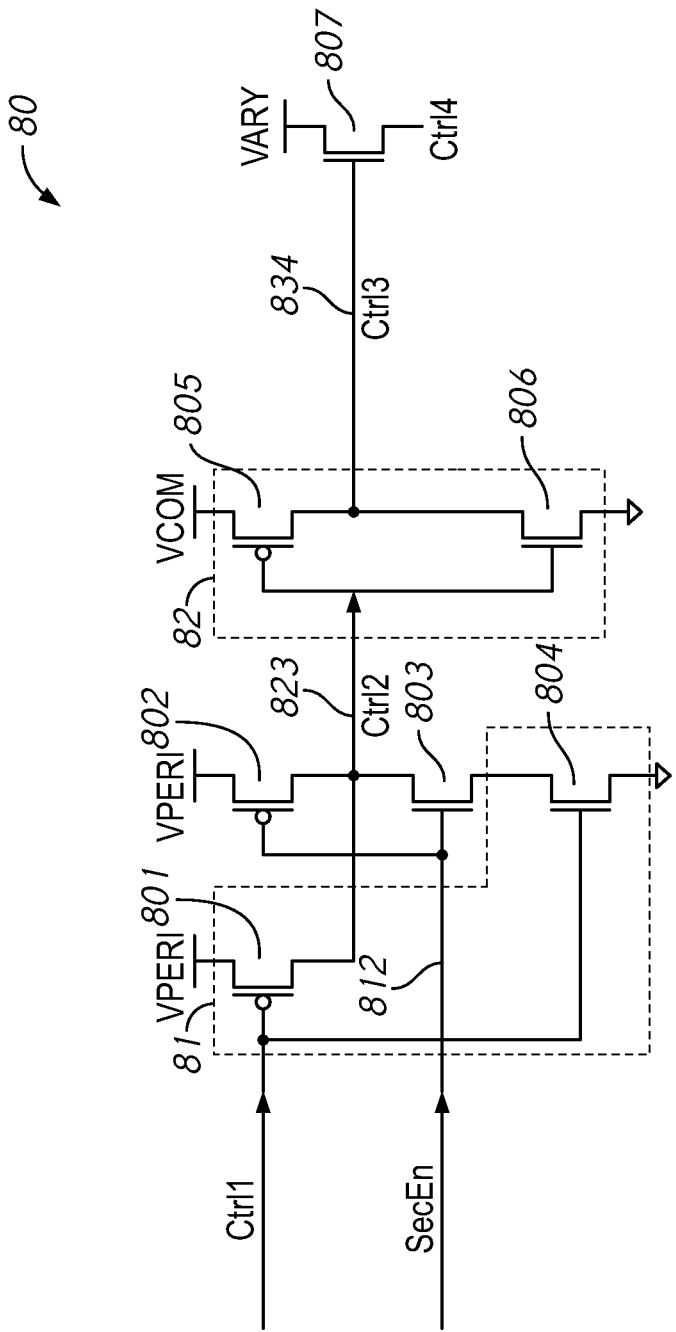
FIG. 8 is a circuit diagram of an array access control circuit for a section according to an embodiment of the disclosure.

FIG. 8 is a circuit diagram of an array access control circuit 80 for a section according to an embodiment of the disclosure. The array access control circuit 80 may be any of the array access control circuits 222, 323 or the array control circuit 50. The array access control circuit 80 may include transistors 801-807.

In some embodiments, the transistor 802 may be a first type of transistor (e.g., p-type field effect transistors (PFET)). The transistor 802 may receive a section enable signal SecEn on a node 812. When the section enable signal SecEn is in an inactive state, at a logic low level, the transistor 802 may provide a positive power supply voltage to a node 823, thus a control signal Ctrl2 having the positive power supply voltage (e.g., at a logic high level) is provided on the node 823. In some embodiments, the transistor 803 may be a second type of transistor (e.g., n-type field effect transistors (NFET)). The transistor 803 may receive the section enable signal SecEn on the node 812. When the section enable signal SecEn is in an active state, at a logic high level, the transistor 803 may couple the transistors 801 and 804.

The array access control circuit 80 may include an inverter 81 that includes the transistors 801 and 804 coupled to the transistor 803. When the section enable signal SecEn is in the active state, the inverter 81 may be activated. The inverter 81 may receive the control signal Ctrl1. When the section enable signal SecEn is in the active state, the inverter 81 may provide a complementary signal of the control signal Ctrl1 as the control signal Ctrl2 to the node 823.

The array access control circuit 80 may include an inverter 82 that includes the transistors 805 and 806. The transistor 805 may be coupled to a positive power voltage. In some embodiments, the positive power supply voltage may be an equalization voltage VEQ or a component voltage VCOM that are higher than the peripheral voltage VPERI. The inverter 82 may receive the control signal Ctrl2 and provide a complementary signal of the control signal Ctrl2 as a control signal Ctrl3.

The control signal Ctrl3 having the same logic level (e.g., either a logic high level or a logic low level) as the control signal Ctrl1 with a different positive power supply voltage (e.g., an equalization voltage VEQ or a component voltage VCOM that are higher than the peripheral voltage VPERI) for the logic high level may be provided to a transistor 807 when the section enable signal SecEn is in the active state at a logic high level. When the section enable signal SecEn is in the inactive state at a logic low level, the control signal Ctrl3 is in an inactive state at a logic low level regardless of the logic level of the control signal Ctrl1.

The transistor 807 may provide an output control signal Ctrl4 responsive to the active control signal Ctrl3, with a voltage range from a reference power supply voltage to a positive power supply voltage that is the array voltage VARY.

Figure 9:
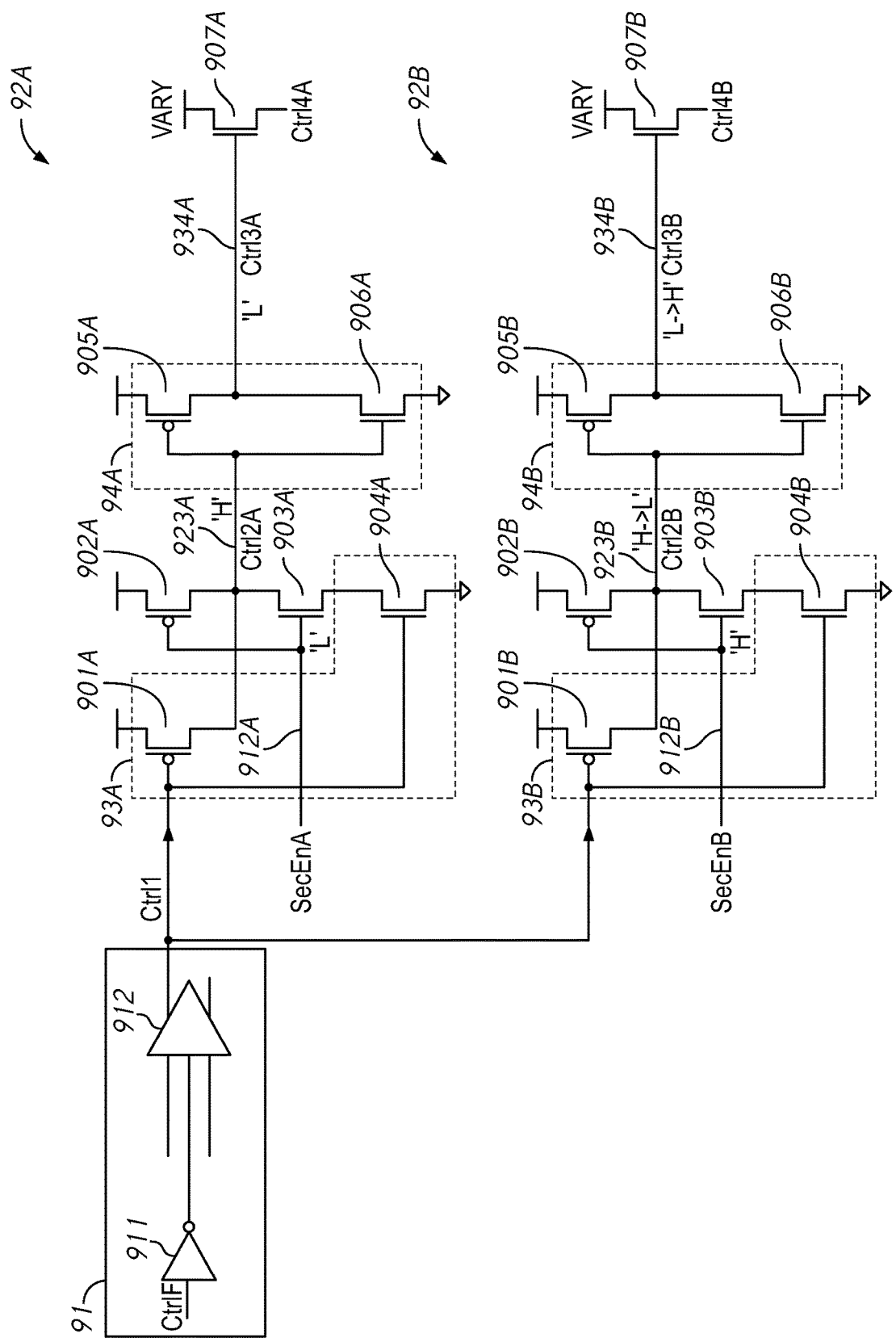
FIG. 9 is a circuit diagram of a level shifter and array access control circuits for sections coupled to the level shifter according to an embodiment of the disclosure.

FIG. 9 is a circuit diagram of a level shifter circuit 91 and array access control circuits 92A and 92B for sections coupled to the level shifter circuit 91 according to an embodiment of the disclosure. The level shifter circuit 91 may be included in the level shifter circuit 211, 311, 312, or any level shifter of the level shifters 41-44. In some embodiments, each of the array access control circuits 92A and 92B may be the array access control circuit 80 earlier described with referring FIG. 8, thus the description of circuit structures of the array access control circuits 92A and 92B is not repeated.

The level shifter circuit 91 may include an inverter 911 and a level shifter 912. The inverter may receive a control signal CtrlF that is a complementary signal of a control signal Ctrl, and provide the control signal Ctrl. The level shifter 912 may receive the control signal Ctrl, which may represent a logic high level with the peripheral voltage VPERI. The level shifter 912 may translate a voltage level of the control signal Ctrl. In some embodiments, the level shifter 912 may provide a control signal Ctrl1 that may represent the logic high level with the equalization voltage VEQ or a component voltage VCOM that are higher than the peripheral voltage VPERI, responsive to the logic high level of the control signal Ctrl. The level shifter 912 may provide the control signal Ctrl1 that may represent the logic low level with the reference power supply voltage, responsive to the logic low level of the control signal Ctrl.

The array access control circuits 92A and 92B may be provided for section A and B in a same bank. The array access control circuits 92A and 92B may receive section enable signals SecEnA and SecEnB, respectively. The section enable signals SecEnA and SecEnB are active-high signals. For example, enable statuses of section A and section B may be represented by a logic high level. The array access control circuits 92A and 92B may also receive the control signal Ctrl1 from the level shifter circuit 91.

In the example of FIG. 9, when a logic level of the section enable signal SecEnA is low ("L"), the array access control circuit 92A may be deactivated and section A is disabled. Responsive to the logic low level of the section enable signal SecEnA, a transistor 902A may provide a positive power supply voltage as a control signal Ctrl2A on a node 923A and a transistor 903A may decouple a transistor 901A and a transistor 904A. Thus, an inverter 93A may be disabled and the inverter 94A may provide a complementary signal of the control signal Ctrl2A at a logic high level as a control signal Ctrl3A at a logic low level on a node 934A. Responsive to the logic low level of the control signal Ctrl3A, the transistor 907A may not provide an array voltage VARY as a control signal Ctrl4A.

In the example of FIG. 9, a logic level of the section enable signal SecEnB is high ("H"), and section B is enabled. Responsive to the logic high level of the section enable signal SecEnB, the transistor 902B may be deactivated and the transistor 903A may couple the transistor 901A and the transistor 904A. Thus an inverter 93B may be enabled. The inverter 93B may receive the control signal Ctrl1 and provide a complementary signal of the control signal Ctrl1A as a control signal Ctrl2B on a node 923B. The inverter 94B may receive the control signal Ctrl2B and provide a complementary signal of the control signal Ctrl2B as a control signal Ctrl3B on a node 934A. Responsive to the logic level of the control signal Ctrl3B, the transistor 907B may or may not provide an array voltage VARY as a control signal Ctrl4B.

Variations of level shifter circuits shared across sections in each bank have been described. Level shifter circuits for adjusting a voltage level of control signals may be shared by sections in a bank. Level shifter circuits for adjusting a voltage level of a section enable signal may be shared for adjusting voltage levels of several control signals within a section. Consequently, power consumption by a reduced number of level shifter circuits may be relatively low and a space occupied by a reduced number of level shifter circuits in a chip may be relatively small.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:
  a plurality of array access control circuits, each array access control circuit of the plurality of array access control circuits configured to receive a respective one of a plurality of section enable signals and each array access control circuit of the plurality of array access control circuits further configured to receive an access control signal, each array access control circuit of the plurality of array access control circuits is configured to provide a section access control signal responsive to the access control signal when the respective section enable signal is in an active state, wherein each array access control circuit of the plurality of array access control circuits corresponds to a respective section of a plurality of sections in a bank; and
  a level shifter circuit coupled to the plurality of array access control circuits and configured to receive a control signal and further configured to provide the plurality of array access control circuits with the access control signal responsive to the control signal,
  wherein a first logic level of the control signal is represented by a first power supply voltage and wherein a first logic level of the access control signal is represented by a second power supply voltage greater than the first power supply voltage, and
  wherein the level shifter circuit is shared across the plurality of sections in the bank.

2. The apparatus of claim 1, further comprising a bank logic circuit configured to receive bank address signals and a command and further configured to provide row address signals responsive to the bank address signals corresponding to the bank logic circuit,
  wherein the bank logic circuit comprises the level shifter circuit configured to provide the access control signal responsive to the bank address signals corresponding to the bank logic circuit, the access control signal provided by the level shifter circuit having an activation timing based receipt of the command.

3. The apparatus of claim 2, further comprising a row decoder circuit configured to receive the row address signals and further configured to provide the plurality of section enable signals responsive to the row address signals,
  wherein the row decoder circuit comprises the plurality of array access control circuits.

4. The apparatus of claim 1, further comprising a memory cell array including a plurality of banks.

5. The apparatus of claim 4, further comprising sense amplifiers coupled to memory cells in a section of the plurality of sections, and
  wherein the array access control circuit corresponding to the section is configured to provide the section access control signal to the sense amplifiers.

6. An apparatus comprising:
  a level shifter configured to receive a first section enable signal and further configured to provide a second section enable signal responsive to the first section enable signal, wherein the level shifter is shared across a plurality of sections in a bank; and
  a plurality of section enable circuits, each section enable circuit of the plurality of section enable circuits configured to receive the second section enable signal and a respective control signal of a plurality of control signals, each section enable circuit of the plurality of section enable circuits is configured to provide a section control signal responsive to the respective first control signal when the second section enable signal in an active state, wherein the plurality of section enable circuits is included in an array access control circuit of a plurality of array access control circuits, each array access control circuit of the plurality of array access control circuits corresponding to a respective section of the plurality of sections in the bank, and
  wherein a first logic level of the first section enable signal is represented by a first power supply voltage and wherein a first logic level of the second section enable signal is represented by a second power supply voltage greater than the first power supply voltage.

7. The apparatus of claim 6, further comprising a row decoder configured to receive row address signals and further configured to provide a plurality of section enable signals including the first and second enable signals responsive to the row address signals,
  wherein the row decoder circuit comprises:
  a plurality of level shifters including the level shifter, the plurality of level shifter circuits configured to receive the respective plurality of section enable signals.

8. The apparatus of claim 7, further comprising a plurality of banks,
  wherein a bank of the plurality of banks comprises a plurality of sections, and
  wherein the plurality of section enable circuits are configured to provide the plurality of second control signals responsive to a corresponding section enable signal of the plurality of section enable signals.

9. The apparatus of claim 8, further comprising sense amplifiers coupled to memory cells in the corresponding section of the plurality of sections,
wherein the plurality of section enable circuits are configured to provide the sense amplifiers with the plurality of second control signals responsive to the corresponding section enable signal of the plurality of section enable signals.

10. An apparatus comprising:
a first array access control circuit configured to receive an access control signal and a first section enable signal and further configured to provide a first section control signal responsive to the access control signal when the first section enable signal is in an active state, wherein the first array access control circuit corresponds to a first section of a plurality of sections in a bank:
a second array access control circuit configured to receive the access control signal and a second section enable signal and further configured to provide a second section control signal responsive to the access control signal when the second section enable signal is in an active state, wherein the second array access control circuit corresponds to a second section of the plurality of sections in the bank; and
a level shifter circuit configured to receive a control signal and further configured to provide the access control signal responsive to the control signal,
wherein a first logic level of the control signal is represented by a first power supply voltage and wherein a first logic level of the access control signal is represented by a second power supply voltage greater than the first power supply voltage, and
wherein the level shifter circuit is shared across the plurality of sections in the bank.

11. The apparatus of claim 10, wherein the level shifter circuit is disposed between the first and second array access control circuits.

12. The apparatus of claim 10, wherein each array access control circuit of the first and second array access control circuits comprises:
a first inverter configured to receive the access control signal and further configured to provide a first internal control signal when the first inverter is enabled; and
a second inverter configured to provide a second internal control signal that is a complementary signal of the first internal control signal.

13. An apparatus comprising:
a first array access control circuit configured to receive an access control sigual and a first section enable signal and further configured to provide a first section control signal responsive to the access control signal when the first section enable signal is in an active state;
a second array access control circuit configured to receive the access control signal and a second section enable signal and further configured to provide a second section control signal responsive to the access control signal when the second section enable signal is in an active state; and
a level shifter circuit configured to receive a control signal and further configured to provide the access control signal responsive to the control signal,
wherein a first logic level of the control signal is represented by a first power supply voltage and wherein a first logic level of the access control signal is represented by a second power supply voltage greater than the first power supply voltage;
wherein each array access control circuit of the first and second array access control circuits further comprises:
a first inverter configured to receive the access control signal and further configured to provide a first internal control signal when the first inverter is enabled;
a second inverter configured to provide a second internal control signal that is a complementary signal of the first internal control signal; and
a transistor configured to receive each respective section enable signal of the first and second section enable signals, and further configured to provide the first power supply voltage as the first internal control signal responsive to the section enable signal in an inactive state.

14. The circuit of claim 12, wherein the second inverter is configured to receive the second power supply voltage.

15. The apparatus of claim 12, wherein each array access control circuit of the first and second array access control circuits further comprises:
a transistor configured to receive each respective section enable signal of the first and second section enable signals as a section enable signal, and further configured to enable the first inverter responsive to the section enable signal in an active state.

16. The apparatus of claim 15, wherein the first inverter comprises a first type of transistor and a second type of transistor, and
wherein the transistor is configured to couple the first type of transistor to the second type of transistor responsive to the section enable signal in an active state.

17. The apparatus of claim 12, further comprising:
a third inverter configured to provide a third internal control signal that is a complementary signal of the second internal control signal.

18. An apparatus comprising:
a first array access control circuit configured to receive an access control signal and a first section enable signal and further configured to provide a first section control signal responsive to the access control signal when the first section enable signal is in an active state;
a second array access control circuit configured to receive the access control signal and a second section enable signal and further configured to provide a second section control signal responsive to the access control signal when the second section enable signal is in an active state; and
a level shifter circuit configured to receive a control signal and further configured to provide the access control signal responsive to the control signal,
wherein a first logic level of the control signal is represented by a first power supply voltage and wherein a first logic level of the access control signal is represented by a second power supply voltage greater than the first power supply voltage;
wherein each array access control circuit of the first and second array access control circuits further comprises:
a first inverter configured to receive the access control signal and further configured to provide a first internal control signal when the first inverter is enabled;
a second inverter configured to provide a second internal control signal that is a complementary signal of the first internal control signal;
a third inverter configured to provide a third internal control signal that is a complementary signal of the second internal control signal; and a transistor configured to receive each respective section enable signal of the first and second section enable signals, wherein the transistor is configured to provide the first inverter with the first power supply voltage responsive to each respective section enable signal.

19. The apparatus of claim 18, wherein the first power supply voltage is a positive power supply voltage, and wherein each array access control circuit of the first and second array access control circuits further comprises another transistor configured to receive the second internal control signal and further configured to provide a third power supply voltage that is a reference power supply voltage as the first internal control signal responsive to the second internal control signal.

20. The apparatus of claim 18, wherein the first power supply voltage is a positive power supply voltage, and wherein each array access control circuit of the first and second array access control circuits further comprises another transistor configured to receive the first internal control signal and further configured to provide the second power supply voltage as the third internal control signal responsive to the first internal control signal.

21. The apparatus of claim 18, wherein the first power supply voltage is a positive power supply voltage, and wherein the third inverter is further configured to receive the second power supply voltage.

22. The apparatus of claim 1, wherein the level shifter circuit is disposed between a first array access control circuit of the plurality of array access control circuits and a second array access control circuit of the plurality of array access control circuits.

23. The apparatus of claim 1, wherein the level shifter circuit is disposed between a first adjacent pair of array access control circuits of the plurality of array access control circuits and a second adjacent pair of array access control circuits of the plurality of array access control circuits.

* * * * *